US008223478B2

(12) United States Patent
Perrault et al.

(10) Patent No.: US 8,223,478 B2
(45) Date of Patent: Jul. 17, 2012

(54) COLLAR STYLE COVER AND HOUSING ASSEMBLY FOR FIELD DEVICE

(75) Inventors: Aaron Andrew Perrault, Shakopee, MN (US); Daniel Justin Herzog, Minneapolis, MN (US)

(73) Assignee: Rosemount Inc., Eden Prairie, MN (US)

( * ) Notice: Subject to any disclaimer, the term of this patent is extended or adjusted under 35 U.S.C. 154(b) by 158 days.

(21) Appl. No.: 12/807,758

(22) Filed: Sep. 14, 2010

(65) Prior Publication Data

US 2012/0063065 A1 Mar. 15, 2012

(51) Int. Cl.
*H05K 5/00* (2006.01)
*H01R 13/44* (2006.01)

(52) U.S. Cl. .................. 361/679.01; 439/139; 439/246

(58) Field of Classification Search .................. None
See application file for complete search history.

(56) References Cited

U.S. PATENT DOCUMENTS

| | | | | |
|---|---|---|---|---|
| 2,784,741 | A * | 3/1957 | Parish | 138/42 |
| 4,053,198 | A | 10/1977 | Doyle et al. | |
| 4,213,018 | A * | 7/1980 | Piston | 200/51.12 |
| 6,485,064 | B1 | 11/2002 | Davidson | |
| 6,799,984 | B2 * | 10/2004 | Starta et al. | 439/246 |
| 6,900,795 | B1 | 5/2005 | Knight, III et al. | |
| 7,367,831 | B2 * | 5/2008 | Starta et al. | 439/246 |
| 7,604,371 | B2 | 10/2009 | Bushee et al. | |
| 8,162,509 | B2 * | 4/2012 | Mackin et al. | 362/267 |
| 2003/0224643 | A1 | 12/2003 | Starta et al. | |
| 2006/0152800 | A1 | 7/2006 | Broden | |
| 2007/0095126 | A1 | 5/2007 | Bailey et al. | |
| 2010/0066263 | A1 | 3/2010 | Bushee et al. | |
| 2010/0097235 | A1 * | 4/2010 | Holloway | 340/660 |
| 2010/0123591 | A1 | 5/2010 | Bauschke et al. | |
| 2010/0323542 | A1 * | 12/2010 | Boucher et al. | 439/137 |

OTHER PUBLICATIONS

International Search Report and Written Opinion for Application Serial No. PCT/US2011/001586; filed Sep. 13, 2011.
International Electrotechnical Commission, Standard 60079-1, Sixth ed. (2007), cover page, table of contents and pp. 10-19.
"Rosemount 470 Transient Protector", Product Data Sheet, 00813-0100-4191, Rev EA, Mar. 2008, 8 pages.
"Rosemount 644 Temperature Transmitter", Product Data Sheet, 00813-0100-4728, Rev MA, Mar. 2008, 24 pages.
"Rosemount 3144P Temperature Transmitter", Product Data Sheet, 00813-0100-4021, Rev KB, Apr. 2010, 26 pages.
"Model 3051 Transmitter With Foundation™ Fieldbus Protocol", Device Revision 7, 00809-0100-4774, Rev BA, pp. 1 and 2-6.

* cited by examiner

*Primary Examiner* — Boris Chervinsky
(74) *Attorney, Agent, or Firm* — Kinney & Lange, P.A.

(57) ABSTRACT

A field device assembly includes a housing body, a first circuitry subassembly mounted to the housing body and positioned at least partially within the housing body, a first cover chassis having a shoulder, mating flame path restricting structures positioned on the first cover chassis and the housing body, a first threaded collar configured to fit about the first cover chassis and to permit rotation relative to the first cover chassis, and a second circuitry subassembly secured to the first cover chassis. The first threaded collar is threadably engaged with the housing body, and includes an engagement structure engaged with the shoulder of the first cover chassis to secure the first cover chassis to the housing body. The second circuitry subassembly includes an electrical connector configured for linear insertion engagement with a mating electrical connector within the housing body to electrically connect the first and second circuitry subassemblies.

20 Claims, 8 Drawing Sheets

COLLAR STYLE COVER AND HOUSING ASSEMBLY FOR FIELD DEVICE

BACKGROUND

The present invention relates to enclosed electronics assemblies and associated methods of manufacture, and more particularly to explosion-proof field devices with removable covers and methods of manufacturing the same.

Field devices, which can include industrial process transmitters, controllers, etc., are used in industrial process facilities in a variety of settings. For example, field devices can include a sensor to sense pressure, temperature, vibration, flow, or nearly any other parameter associated with an industrial process, and/or can include an actuator or other device that manages, controls, or otherwise interacts with an industrial process. Many industrial process facilities are located in corrosive environments, or may be subject to a risk of fire, explosion, or vibration, and therefore field devices must generally be constructed to be explosion-proof and otherwise able to suitably withstand operating environment conditions. The field device can communicate—wirelessly or using a hard-wired connection—with a control room, other device, etc. to help provide industrial process management. Typically, field devices are installed at desired locations and are configured by an operator at the installation location using a programming device. However, such programming devices can be costly, and must be transported to the installation location for use by the operator. Yet it is desired to be able to configure field devices without having to remove transmitter covers, because covers may be difficult to remove and then reinstall and cover removal undesirably exposes interior regions of the transmitters to the environment. It is therefore desired to provide a local operator interface suitable for use with a field device.

Field devices typically utilize a threaded cover that is removably secured to a transmitter housing to provide an explosion-proof enclosure. However, the torque exerted when engaging (or disengaging) the cover with the transmitter housing as well as vibrations or shocks encountered during operation could possibly disrupt, damage or even destroy sensitive circuitry if the cover physically contacts that circuitry or associated structures (e.g., a display glass carrying the LOI circuitry). For such reasons, a conventional threaded cover is problematic in providing a local operator interface (LOI) for a field device with LOI components located near the cover.

Figure 1:
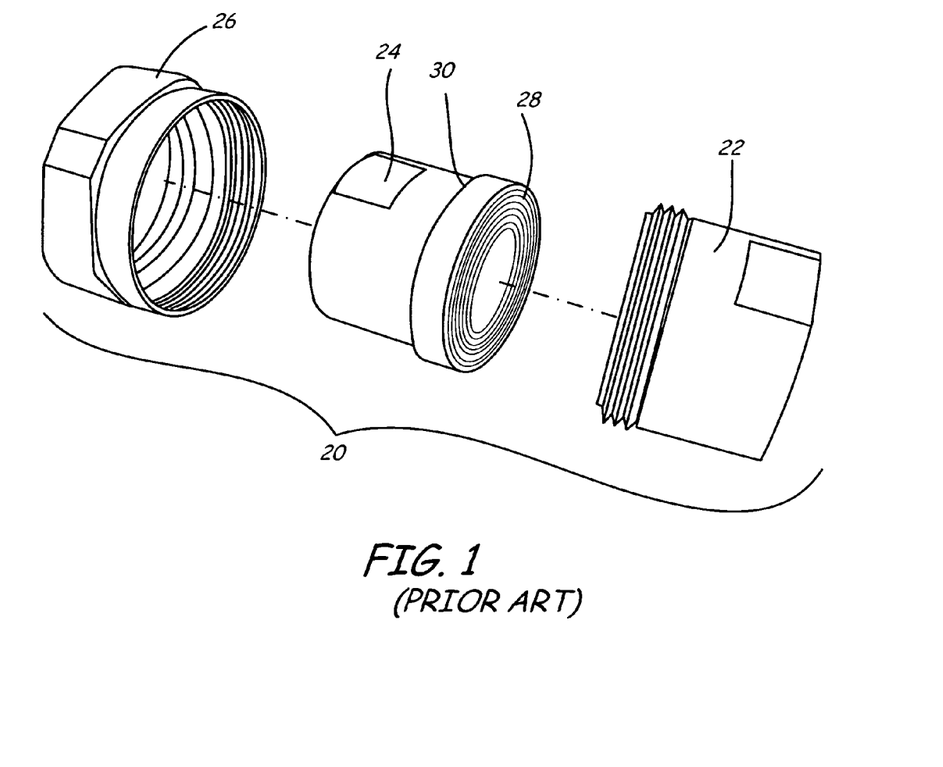
FIG. 1 is an exploded perspective view of a prior art explosion-proof pipe union.

FIG. 1 is an exploded perspective view of a prior art pipe union assembly 20 (available from Rosemount, Inc., Chanhassen, Minn., as Part No. 00079-0288-0001) that meets the explosion-proof requirements of International Electrotechnical Commission (IEC) standard 60079-1 (2007). The assembly 20 includes a first fitting 22, a second fitting 24, and a collar 26. The first and second fittings 22 and 24 are generally open-ended cylindrical members used to connect adjacent pipes, conduits, etc. The first and second fittings 22 and 24 have mating serrations 28 (the serrations 28 on the first fitting are not visible in FIG. 1) that engage to form an explosion-proof flame path. The collar 26 can be positioned around the second fitting 24 against a shoulder 30 thereof and threaded onto the first fitting 22 to force the second fitting 24 into engagement with the first fitting 22. The assembly 20 allows rotation between the first and second fittings 22 and 24.

SUMMARY

A field device assembly according to the present invention includes a housing body, a first circuitry subassembly mounted to the housing body and positioned at least partially within the housing body, a first cover chassis having a shoulder, mating flame path restricting structures positioned on the first cover chassis and the housing body, a first threaded collar configured to fit about the first cover chassis and to permit rotation relative to the first cover chassis, and a second circuitry subassembly secured to the first cover chassis. The first threaded collar is threadably engaged with the housing body, and includes an engagement structure engaged with the shoulder of the first cover chassis to secure the first cover chassis to the housing body. The second circuitry subassembly includes an electrical connector configured for linear insertion engagement with a mating electrical connector within the housing body to electrically connect the first and second circuitry subassemblies.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

Field devices, such as industrial process transmitters and controllers, are often used in environments that expose the devices to corrosion, fire, explosion, vibration, and other extreme conditions. For that reason, field devices for use in industrial process facilities are specially constructed so that they can suitably withstand anticipated operating conditions. To that end, field devices typically have rugged housings made of durable cast and machined metallic materials with a threadably attached (i.e., screw-on) cover. The cover can include a transparent portion positioned over a local interface subassembly. In order to meet explosion-proof requirements, the transparent portion is often provided as a relatively thick (e.g., approximately 9 mm or more) piece of glass.

It is desirable to have inputs to the field device that can be actuated without removing the cover from the housing and exposing an interior of the field device to the environment. Sensing a capacitive signal with touch circuitry having one or more conductive pads (or buttons) is possible through a dielectric material like glass or plastic that forms the transparent portion of the cover. The conductive pad of the touch circuitry and a human finger (or other appendage) form a capacitor separated by the dielectric forming transparent portion of the cover. Signal strength of the capacitive measurement is related to the dielectric, with better signal detection resulting from higher dielectric separating material. For that reason, a relatively thick transparent portion of the cover may be undesirable with respect to signal strength. Furthermore, any air gap in the capacitor will further reduce signal strength, so the amount of air should be minimized to maintain acceptable signal levels. Therefore, it is desirable to reduce or eliminate an air gap between the touch circuitry and the glass of the cover, and to relatively precisely control any such air gap. However, because field devices typically have a threaded cover, which is desirable for meeting explosion-proof requirements, the torque exerted when engaging (or disengaging) the cover with the transmitter housing could possibly disrupt, damage or even destroy sensitive display, touch and/or other circuitry if the cover contacts that circuitry. Vibrations can also lead to similar damage if circuitry is in physical contact with the cover. Moreover, the attachment of a conventional threaded cover makes it difficult to control an air gap between touch circuitry and a transparent portion of the cover. Tolerances between the cover circuitry attached to the housing are difficult to control, and mounting electrical circuitry to a threaded cover that rotates relative to the housing creates problems with respect to making electrical connections between that circuitry and non-rotating components in the housing. It should also be noted that although touch interfaces other than capacitive types are available, certain other types of touch interfaces are unsuitable for use in typical industrial process environments. For example, touch screens that utilize a deformable touch layer may be unsuitable for maintaining an explosion-proof field device enclosure.

In general, the present invention provides a field device system and method of assembly that allows sensitive electronic circuitry to be mounted to a cover that is secured to an associated housing to form an explosion-proof and flameproof enclosure while reducing a risk of damage to the electronic circuitry. One or more generally non-rotating electrical connector configured for linear insertion with a mating electrical connector can be used to make suitable electrical connections between circuitry carried by and attached to the cover and circuitry carried by and attached to the housing. The cover can be secured against rotation relative to the housing by a suitable anti-rotation structure. A collar can be engaged with the housing (e.g., threadably engaged) and with the cover to retain the cover relative to the housing. The cover can include a shoulder portion that contacts the collar such that the collar applies a force to hold the cover against the housing. The collar can rotate relative to the housing and relative to the cover while the cover can remain rotationally fixed relative to the housing. Mating flame path restricting structures, such as serrations, are located on mating faces of the cover and housing to provide a suitably explosion-proof flame path between those components. In some embodiments, multiple cover assemblies according to the present invention can be provided for a given field device, such as to provide electronic circuitry in covers at opposite ends of a given transmitter housing. Numerous features and benefits of the present invention will be understood in view of the discussion that follows and in view of the appended figures.

Figure 2A:
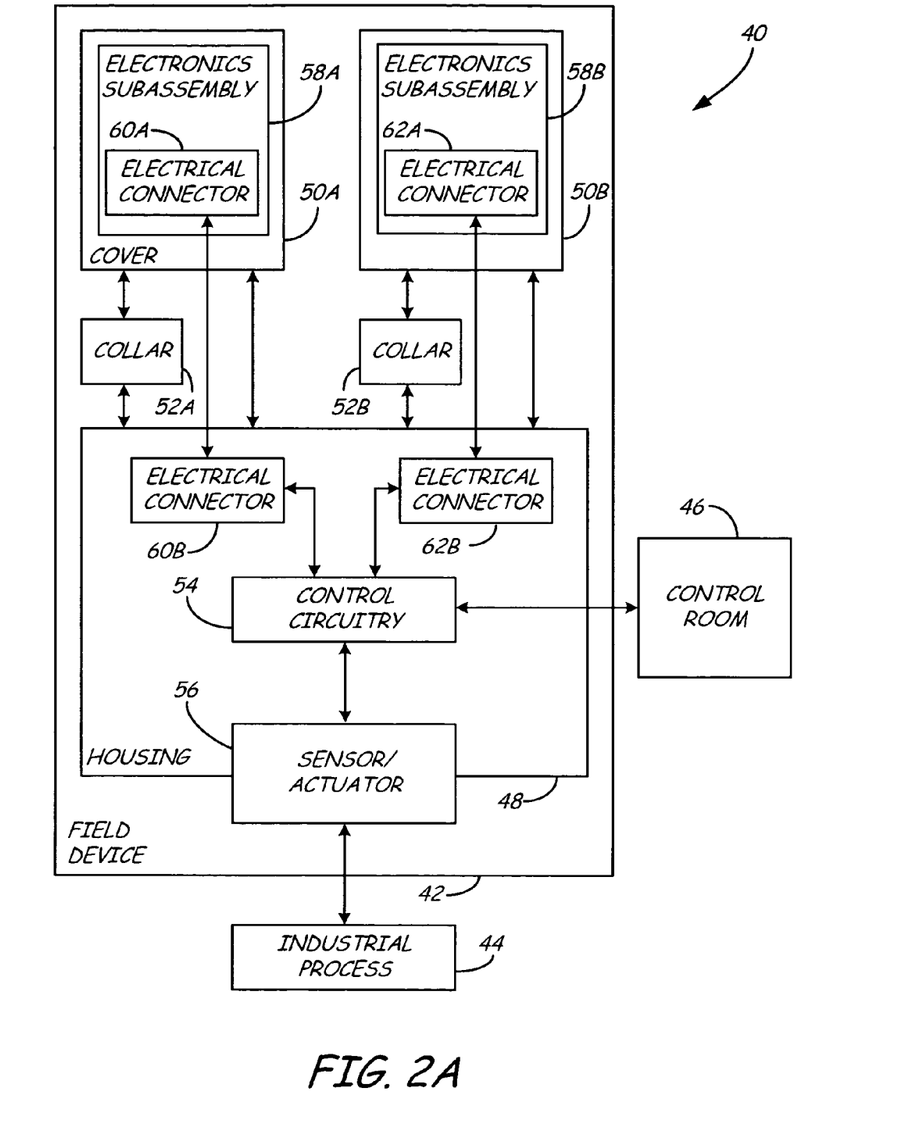
FIG. 2A is a block diagram illustrating a first embodiment of a field device system according to the present invention.
Figure 2B:
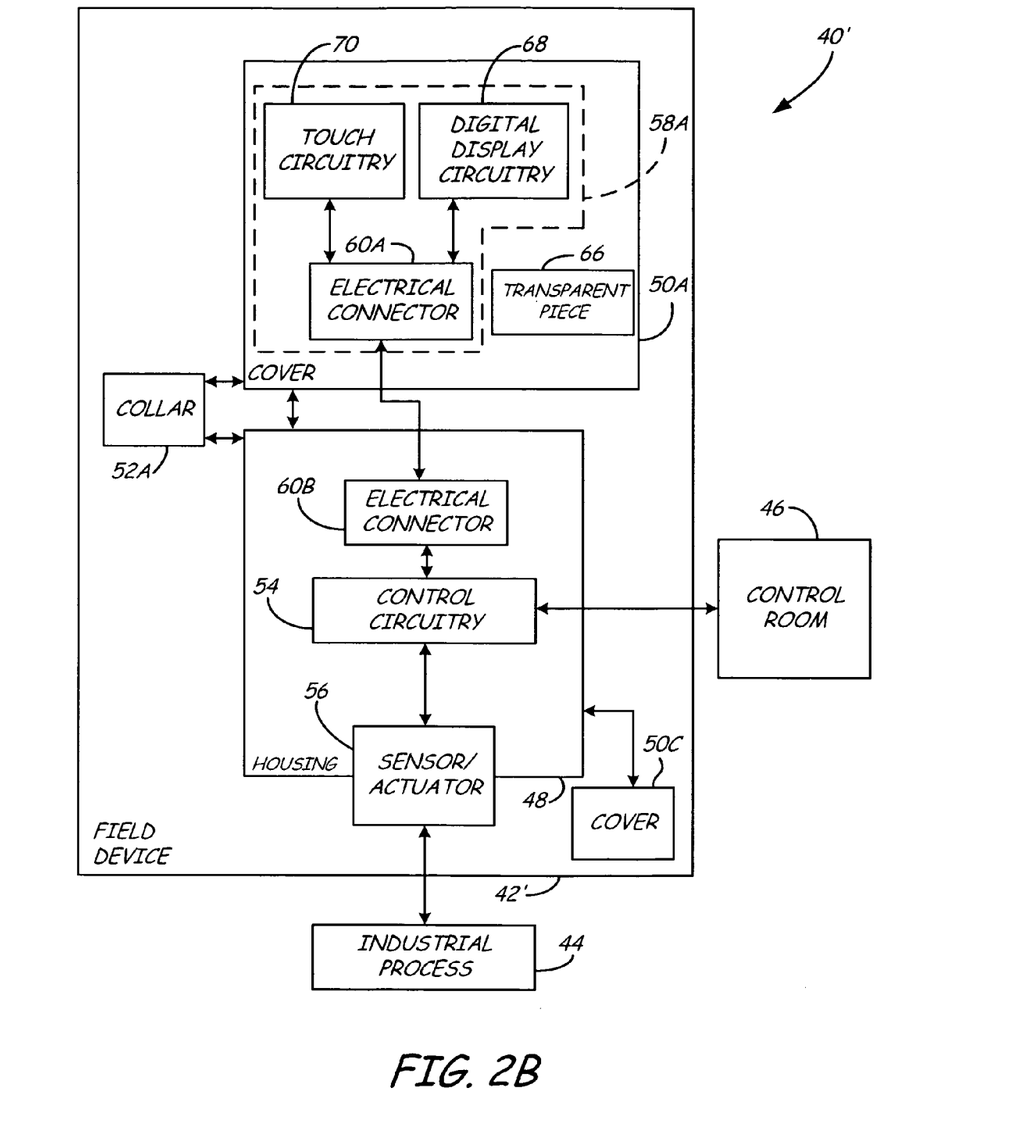
FIG. 2B is a block diagram illustrating a second embodiment of a field device system according to the present invention.
Figure 2C:
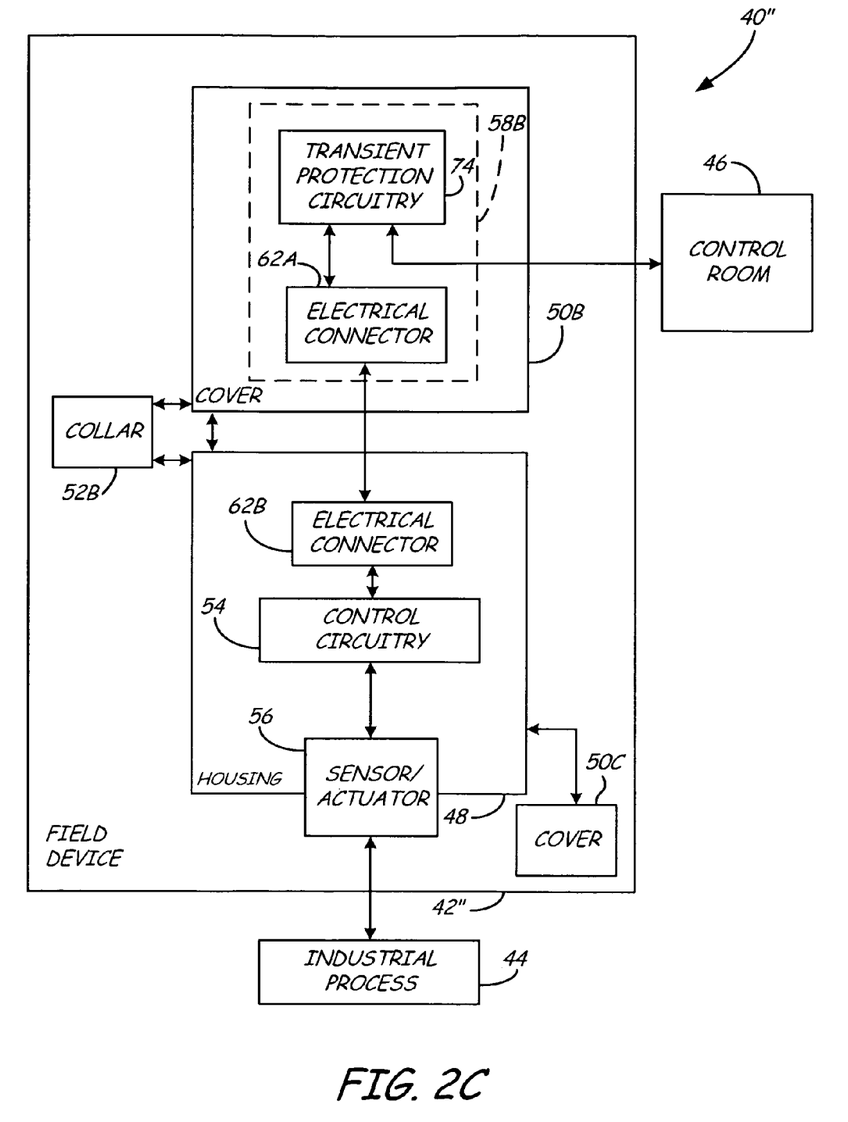
FIG. 2C is a block diagram illustrating a third embodiment of a field device system according to the present invention.

FIGS. 2A-2C schematically illustrate a number of alternative embodiments of the present invention, though it should be understood that further embodiments are possible. Additional details of the present invention relevant to the embodiments of FIGS. 2A-2C are shown in FIGS. 3-7, which are discussed in due course.

FIG. 2A is a block diagram illustrating a first embodiment of a field device system 40 that includes a field device 42 positioned to interact with an industrial process 44 and a control room 46 that can communicate with the field device 42. The field device 42 includes a housing 48, covers 50A and 50B, collars 52A and 52B, control circuitry 54, a sensor/actuator 56, electronics subassemblies 58A and 58B, and electrical connectors 60A, 60B, 62A and 62B.

The control room 46 can include displays, processors, memory, asset management or control software (e.g., AMS Suite and PlantWeb® software available from Emerson Process Management, Chanhassen, Minn.), and other components for managing and controlling the industrial process 44 and for collecting and analyzing data from the field device 42.

The control circuitry 54 is secured to and located at least partially within the housing 48. Further, the control circuitry 54 is operatively connected to both of the electronics subassemblies 58A and 58B, and can include one or more processors of conventional configurations. It should be noted that in alternative embodiments the control circuitry 54 can be implemented as a plurality of discrete circuitry subassemblies, as desired for particular applications. For instance, control circuitry can be provided separately from terminal block circuitry (not shown) for communicating with the control room 46 and the sensor/actuator 56.

The sensor/actuator 56 is positioned to interact with the industrial process 44. In various embodiments the sensor/actuator 56 can be configured to sense pressure, temperature, vibration, flow, or nearly any other parameter associated with the industrial process 44 and/or can include an actuator or other device that manages, controls, or otherwise interacts with the industrial process 44. The control circuitry 54 is electrically connected to the sensor/actuator 56, and can be of any suitable configuration for controlling operation of the sensor/actuator 56, gathering data, processing data, etc.

The field device 42 can communicate with the control room 46. Communication between the field device 42 and the control room 46 can be through any suitable wireless or hard-wired connection. Moreover, communication with the control room 46 can be direct or through a network of any number of intermediate devices (not shown). The control circuitry 54 can help manage and control communication to and from the field device 42.

In the illustrated embodiment, the electronics subassemblies 58A and 58B are attached to and carried by the covers 50A and 50B, respectively, such as with suitable fasteners. The electronics subassemblies 58A and 58B can each provide essentially any desired functionality. For example, in one embodiment, the electronics subassembly 58A can provide a local operator interface (LOI) with display and touch interface capabilities and the electronics subassembly 58B can provide transient protection for connected circuitry. Nearly any type of desired circuitry can be provided in either of the electronics subassemblies 58A and 58B in alternative embodiments.

In the illustrated embodiment, the electronics subassembly 58A includes an electrical connector 60A, and the electronics subassembly 58B includes an electrical connector 62A. Electrical connectors 60B and 62B are provided to allow selective mating engagement with the electrical connectors 60A and 62A, respectively, to provide suitable electrical connections between the electronics subassemblies 58A and 58B and the control circuitry 54. Although in the illustrated embodiment the electrical connectors 60B and 62B are shown as discrete components located in the housing 48 separate from but operably connected to the control circuitry 54, in further embodiments the electrical connectors 60B and 62B could be integrated with the control circuitry 54 or have any other suitable configuration. In one embodiment, the electrical connectors 60A, 60B, 62A and 62B can each be conventional pin-type electrical connectors (e.g., 10-pin connectors, etc.) that allow one or more discrete electrical connections to be created by a substantially linear insertion of one component (e.g., the electrical connector 60A) into a mating connector (e.g., the electrical connector 60B). The number of discrete electrical connections made by each electrical connector can vary as desired for particular applications. In further embodiments, other types of linear insertion electrical connectors can be utilized, as well as other types of electrical connectors that may form electrical connections with something other than a linear motion.

The collars 52A and 52B can be configured as threaded collars for removably securing the covers 50A and 50B, respectively, to the housing 48. The covers 50A and 50B can be positioned against the housing 48, for instance, at different openings in the housing 48, and can be held against the housing 48 by engagement of the collars 52A and 52B with the covers 50A and 50B, respectively, and the housing 48. An explosion-proof flame path and environmental seal (for simplicity, the environmental seal is not shown in FIG. 2A) can be provided between the covers 50A and 50B and the housing 48, such that the field device 42 creates a sealed and explosion-proof enclosure. In some embodiments, a suitable anti-rotation structure can be engaged between each cover 50A and 50B and the housing 48 to limit or prevent rotation of the covers 50A and 50B relative to the housing 48. This, in turn, can help limit or prevent rotation of the electronics subassemblies 58A and 58B relative to the control circuitry 54 when the electronics subassemblies are fixedly secured to the covers 50A and 50B, respectively and the control circuitry 54 fixedly secured to the housing 48. In various embodiments, the anti-rotation structure can be the electrical connectors 60A, 60B, 62A and 62B or a flame path restricting structure, or can be an additional structure (not shown in FIG. 2A), such as one that includes a spline, key, pin, dovetail, boss, tether, etc.

In further embodiments, a suitable retaining structure (not shown) can be provided to retain the collars 52A and 52B relative to the covers 50A and 50B, respectively. For instance, the collars 52A and 52B can each be trapped between a stop and a shoulder on the covers 50A and 50B, respectively, while still permitting rotation or other suitable movement relative to the covers 50A and 50B. Such a configuration would help reduce a risk that the collars 52A and 52B could be lost or mislaid when the covers 50A and/or 50B are removed from the housing 48 and then re-engaged by an operator.

The field device 42 can include additional components not specifically shown in FIG. 2A. For example, suitable environmental seals can be provided, and additional circuitry can be included as desired. Moreover, it will be appreciated that the particular configuration of the field device 42 can vary as desired for particular applications.

Figure 3:
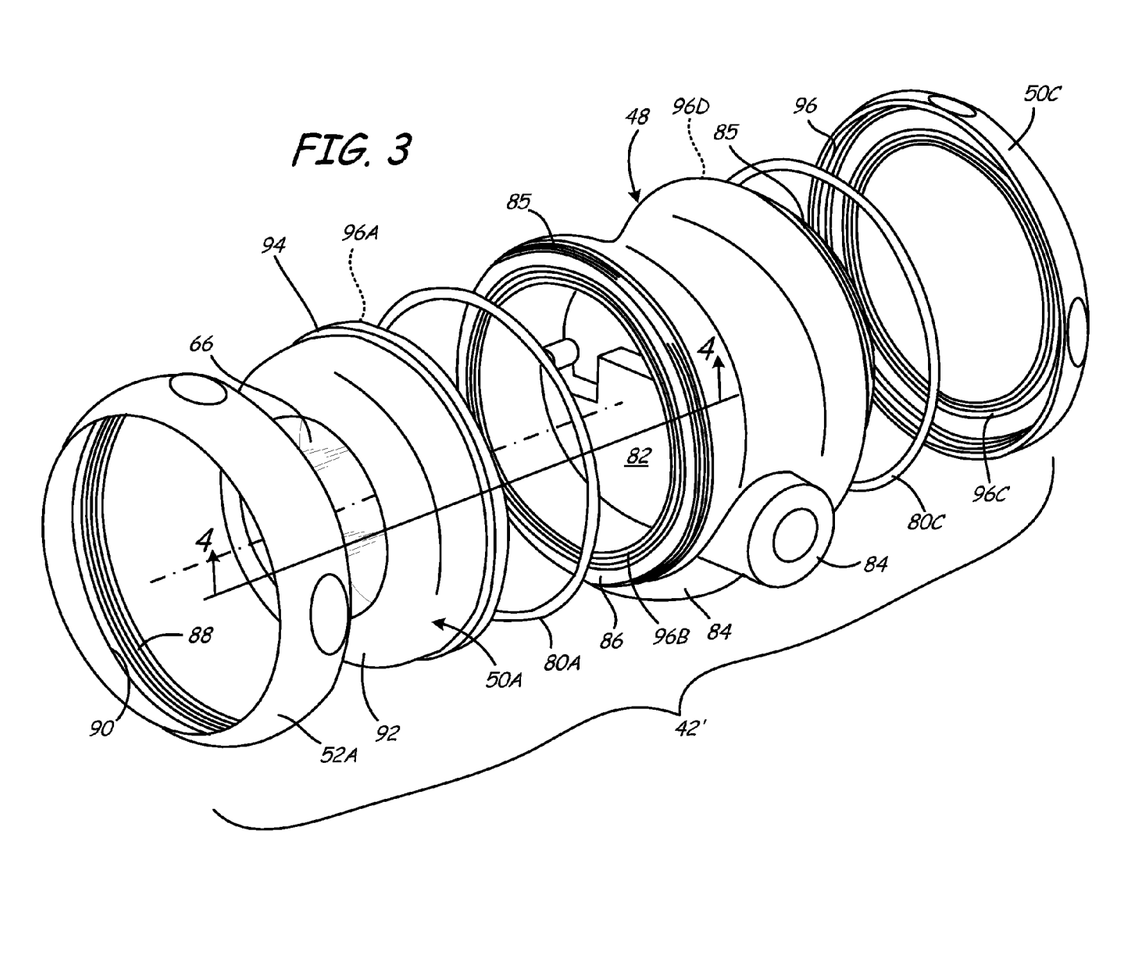
FIG. 3 is an exploded perspective view of a cover and housing assembly for a field device according to the present invention.

FIG. 2B is a block diagram illustrating a second embodiment of a field device system 40' (see also FIG. 3 in particular). The configuration of the field device system 40' is generally similar to that of the field device system 40 described with respect to FIG. 2A. However, the system 40' includes a cover 50A that carries an electronics subassembly 58A as well as a cover 50C that is a conventional threaded type that does not carry any electronics. The cover 50A can include a transparent cover piece 66 through which at least a portion of the electronics subassembly 58A is visible from a vantage point outside the field device 42'. An explosion-proof flame path restricting structure can be provided between the cover 50A and the housing 48. An explosion-proof flame path can be formed through the threaded engagement between the cover 50C and the housing 48 in a known manner and/or with an explosion-proof flame path restricting structure similar to that provided for the cover 50A.

In the embodiment illustrated in FIG. 2B, the electronics subassembly 58A defines a local operator interface (LOI) and includes an electrical connector 60A, digital display circuitry 68, and touch circuitry 70. Portions of both the digital display circuitry 68 and the touch circuitry 70 can be positioned adjacent to and made visible through the transparent cover piece 66. The touch circuitry 70 can be of any suitable configuration to enable touch actuation by an operator, and the digital display circuitry 68 can be configured as one or more liquid crystal displays (LCDs) with optional backlighting functionality, or as any other type of digital display capable of producing a visual output (alternatively an analog display could be provided). In one embodiment, the touch circuitry 70 provides one or more touch actuatable regions defined by electrically conductive pads (or buttons) for selectively forming a capacitor with an appendage (e.g., finger) of an operator positioned near any of those regions of the touch circuitry 70. In that way, the touch circuitry 70 can provide capacitive touch actuation in a known manner. It will be appreciated that the conductive pads or buttons defining the touch actuatable regions of the touch circuitry 70 can have any suitable configuration, as desired for particular applications. In one embodiment, the touch circuitry 70 can have substantially transparent electrical traces (e.g., formed of indium-tin-oxide material) supported on glass layers with at least a portion of the touch circuitry 70 positioned over (i.e., on top of) the digital display circuitry 68, such that the digital display circuitry 68 is visible through the touch circuitry 70. This allows the digital display circuitry 68 to display essentially any information, and for the touch actuatable regions of the touch circuitry 70 to receive a variety of different inputs correlated to information displayed at each button of the touch circuitry 70. In that way, the electronics subassembly 58A provides for a dynamic operator interface that can display a variety of information and receive a variety of inputs within a relatively small area. Those of ordinary skill in the art will appreciate that any suitable menu and display layout can be provided by the electronics subassembly 58A as desired for particular applications. In some embodiments, the touch circuitry 70 and the digital display circuitry 68 can each have a chip-on-glass (COG) configuration. It should also be noted that in alternative embodiments, the touch circuitry 70 and the digital display circuitry 68 could be located adjacent to one another or in other arrangements instead of being directly on top of one another.

Because the digital display circuitry 68 and the touch circuitry 70 may be sensitive to contact with other objects, the electronics subassembly 58A can be fixedly mounted to the cover 50A in a manner that restricts or prevents relative movement (e.g., rotation).

The field device 42' can include additional components not specifically shown in FIG. 2B. Moreover, it will be appreciated that the particular configuration of the field device 42' can vary as desired for particular applications.

FIG. 2C is a block diagram illustrating a third embodiment of a field device system 40". The configuration of the field device system 40" is generally similar to that of the field device system 40' described with respect to FIG. 2B (which in turn is similar to the field device system 40 described with respect to FIG. 2A). However, in the system 40" the field device 42" includes a cover 50B that carries an electronics subassembly 58B that provides transient electrical protection (rather than an LOI as with the system 40'). Transient electrical protection helps to prevent damage to the field device 42" from transients induced on loop wiring by lightning, welding, heavy electrical equipment, switch gears, etc. In the embodiment illustrated in FIG. 2C, the electronics subassembly 58B includes transient protection circuitry 74 and an electrical connector 62A. Power from the control room 46 can be routed through the transient protection circuitry 74 before reaching the control circuitry 54, etc. The electronics subassembly 58B can be fixedly mounted to the cover 50B in a manner that restricts or prevents relative movement (e.g., rotation). As illustrated, an additional cover 50C is provided for the field device 42". It should be understood that one or more additional covers of any desired configuration could be provided in alternative embodiments, or cover 50C could be omitted.

The transient protection circuitry 74 can have any desired configuration. For instance, the transient protection circuitry can include one or more of the following components in any desired configuration: a lightning tube connected to ground, a pair of resistors for limiting charges to diodes in the circuit, low-capacitance diodes to rectify a charge, one or more transient absorbers (e.g., a Transorb® assembly of mutually opposed Zener diodes, available from Vishay Americas, Shelton, Conn.), or other known transient protection components. In some embodiments, the transient protection circuitry 74 can have a configuration known in the art, such as like that used in a Rosemount® 470™ Transient Protector device (available from Emerson Process Management, Chanhassen, Minn.), or that disclosed in commonly-assigned co-pending U.S. Patent Application Pub. No. 2010/0123591 A1.

Because components of transient protection circuitry can be relatively large, at least compared to the housing of a typical field device, it is difficult to accommodate that circuitry within limited space constraints of the housing. By mounting the transient protection circuitry 74 to the cover 50B, the cover 50B can be enlarged or otherwise configured to accommodate the transient protection circuitry 74 without interfering with components inside the housing 48 or requiring enlargement or other redesign of the housing 48, and without the need to a separate add-on transient protection device enclosure.

The field device 42" can include additional components not specifically shown in FIG. 2C. Moreover, it will be appreciated that the particular configuration of the field device 42" can vary as desired for particular applications.

FIG. 3 is an exploded perspective view of portions of a field device 42' of the type previously described with respect to FIG. 2B, though persons of ordinary skill in the art will recognize that features depicted in FIG. 3 will be readily applicable to other embodiments as well (such as those of FIGS. 2A and 2C). For simplicity, circuitry and other internal components in the cover 50A and the housing 48 are not shown in FIG. 3.

As shown in FIG. 3, the field device 42' includes a housing 48, covers 50A and 50C, collar 52A, and seals 80A and 80C. In the illustrated embodiment, the housing 48 has approximately a cylindrical shape, with a midsection having a reduced diameter. Opposite ends of the housing 48 open to two interior compartments (only one opening and compartment is visible in FIG. 3), which can be separated by an internal wall 82 (though suitable electrical feedthroughs can be provided that pass through the internal wall 82). One or more necks 84 that open to at least one of the interior compartments of the housing 48 can be provided for the attachment of suitable conduits and/or for mounting the field device 42' to interact with an industrial process 44 (see FIG. 2B). Threads 85 can be provided on the housing 48. The housing 48 can be made of a metallic material, or other suitable materials.

As shown in FIG. 3, the seals 80A and 80C are positioned between the housing 48 and the covers 50A and 50C, respectively. In the illustrated embodiment, the seals 80A and 80C are configured as conventional O-ring type seals that can create a fluidic environmental seal between the housing 48 and the covers 50A and 50C. Grooves 86 can be provided in the housing 48 and/or the covers 50A and 50C to receive the seals 80A and 80C.

In the illustrated embodiment, the collar 52A has a generally annular shape, and can include threads 88 and a shoulder 90 (or engagement structure), each of which can be positioned along interior or inwardly-facing surfaces of the collar 52A. Also, the collar 52A can include suitable structures to allow for engagement of suitable tooling, such as a wrench, for rotating the collar 52A. The collar 52A can be made of a metallic material, or other suitable materials. In the illustrated embodiment, the collar 52A is configured to fit around the cover 50A, with the threads 88 of the collar 52A engaging the threads 85 of the housing 48. In further embodiments, a suitable retaining structure (not shown), such as a stop, can be provided to help retain the collar 52A about the cover 50A (in an axial direction) while still permitting rotation of the collar 52A relative to the cover 50A.

The cover 50A as shown in FIG. 3 includes a chassis 92 and a transparent cover piece 66 secured to the chassis 92. In the illustrated embodiment, the transparent cover piece 66 is positioned at a central region of the chassis 92. The chassis 92 can be made of a metallic material and the transparent cover piece 66 can be made of glass that is approximately 9 mm or more thick, in order to meet explosion-proof requirements. The electronics subassembly 58A (not shown in FIG. 3 for simplicity) can be secured to the chassis 92 and positioned to be at least partially visible through the transparent cover piece 66 (see FIG. 6). In alternative embodiments, the transparent cover piece 66 could be omitted and the cover 50A formed entirely as the chassis 92.

A shoulder 94 can be provided on the chassis 92, and can be located on an exterior or outwardly-facing surface of the cover 50A at a perimeter of the cover 50A. The shoulder 94 on the cover 50A and the shoulder 90 on the collar 52A are configured to seat against one another in physical contact when the collar 52A is engaged with the housing 48, such that the collar 52A transmits an engagement force to the cover 50A through the respective shoulders 90 and 94 to help urge the cover 50A against the housing 48. When the collar 52A is being rotated, the shoulders 90 and 94 may slide relative to each other.

As shown in FIG. 3, the cover 50C includes threads 96, which can be engaged with the threads 85 on the housing. The cover 50C can be made of a metallic material. In the illustrated embodiment, the cover 50C does not include a transparent portion and would not carry an electronics subassembly.

The covers 50A and 50C are located at opposite ends of the housing 48, at openings to the interior compartments of the housing 48. The covers 50A and 50C and the housing 48 can each include flame path restricting structures 96A-96D (the flame path restricting structure 96A on the cover 50A and the flame path restricting structure 96D on the housing are not visible in FIG. 3). The flame path restricting structures 96A and 96B on the cover 50A and the housing 48, respectively, are configured for mating engagement to form an explosion-proof flame path therebetween. Likewise, the flame path restricting structures 96C and 96D on the cover 50C and the housing 48, respectively, are configured for mating engagement to form another explosion-proof flame path therebetween.

Figure 4:
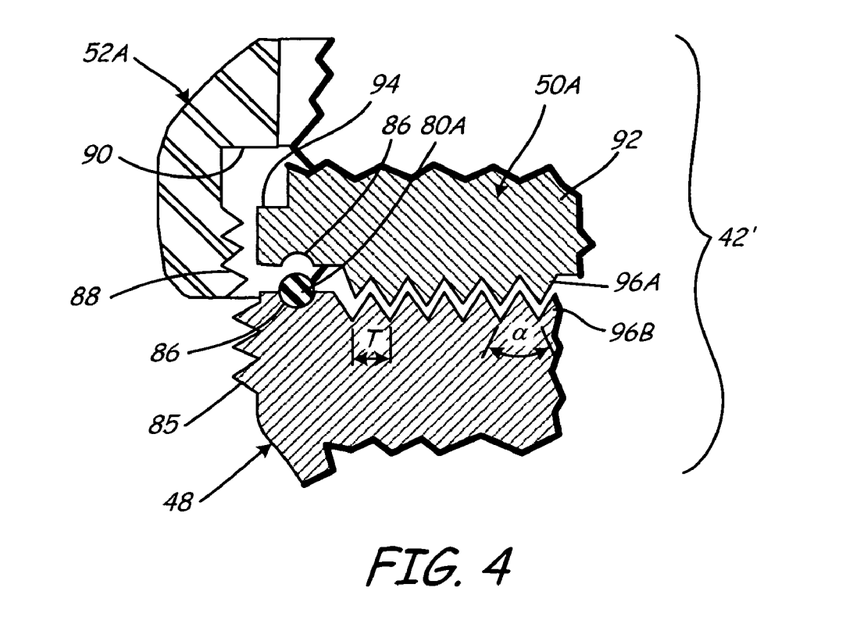
FIG. 4 is a sectional view of a portion of the field device, taken along line 4-4 of FIG. 3.

In one embodiment the flame path restricting structures 96A-96D can be configured as a plurality of concentric, annular serrations. FIG. 4 is an enlarged sectional view of a portion of the field device 42', taken along line 4-4 of FIG. 3, showing an embodiment of the flame path restricting structures 96A and 96B as axially-facing serrations located radially inward from an environmental seal 80A. The flame path restricting structure 96A is located generally adjacent to the shoulder 94 (facing in opposite directions), and the flame path restricting structures 96B is located generally adjacent to the threads 85 and the seal 80A. As shown in FIG. 4, the flame path restricting structures 96A and 96B include five fully engaged serrations. Though greater or lesser numbers of serrations could be provided in alternative embodiments, at least five serrations may be desired in certain applications to be suitably explosion-proof. The serrations of the flame path restricting structures 96A and 96B can have a pitch T and an included angle α. In some embodiments, the pitch T can be ≧1.25 mm (0.05 inch) and the included angle a can be approximately 60° (+/−5°), with a total (radial) width of the serrated face of each of the flame path restricting structures 96A and 96B being approximately 8.255 mm (0.325 inch).

Because an explosion-proof flame path is provided by the restricting structures 96A and 96B, the threads 85 and 88 need not provide an explosion-proof flame path, and thus only a relatively small number of turns need to be provided. A smaller number of turns of the threads 85 and 88 can allow for engagement of the collar 52A to the housing 48 using limited rotation of those parts, which can allow for faster engagement.

It should be noted that in further embodiments other types of flame path restricting structures other than serrations could be utilized in conjunction with the present invention. For instance, any flame path restricting structures compatible with IEC standard 60079-1 (2007) could be utilized. The serrated flame path restricting structures 96A and 96B are shown in FIGS. 3 and 4 merely by way of example, and not limitation.

Figure 5:
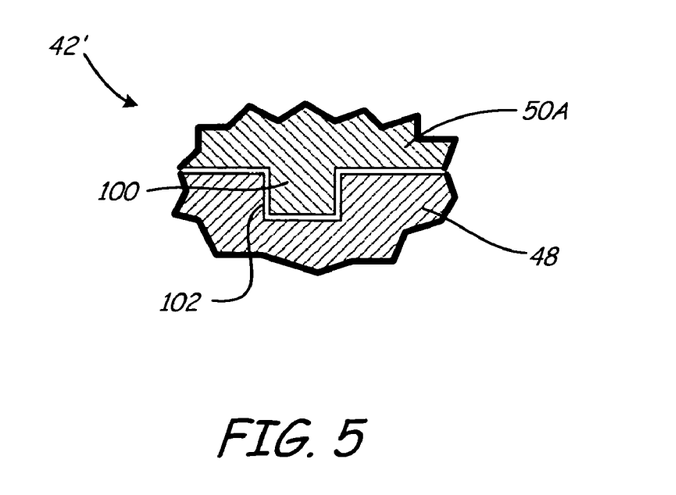
FIG. 5 is a sectional view of a portion of the field device, illustrating on embodiment of an anti-rotation structure.

FIG. 5 is a sectional view of a portion of the field device 42', illustrating on embodiment of an anti-rotation assembly. As shown in FIG. 5, the cover 50A (e.g., the chassis 92 of the cover 50A) includes a first anti-rotation structure 100 and the housing 48 includes a second anti-rotation structure 102. The first and second anti-rotation structures 100 and 102 can engage each other to limit or prevent rotation between the cover 50A and the housing 48. The first and second anti-rotation structures 100 and 102 can be positioned at or near opposing surfaces of the housing 48 and the cover 50A. In the illustrated embodiment, the first anti-rotation structure 100 is configured as a spline and the second anti-rotation structure 102 is configured as a groove that can accept the spline. In an alternative embodiment, the spline could be on the housing 48 and the groove on the cover 50A. Furthermore, in other alternative embodiments, the first and second anti-rotation structures 100 and 102 can be configured as any suitable spline, key, pin, dovetail, boss, tether, or other anti-rotation structure or structures.

Figure 6:
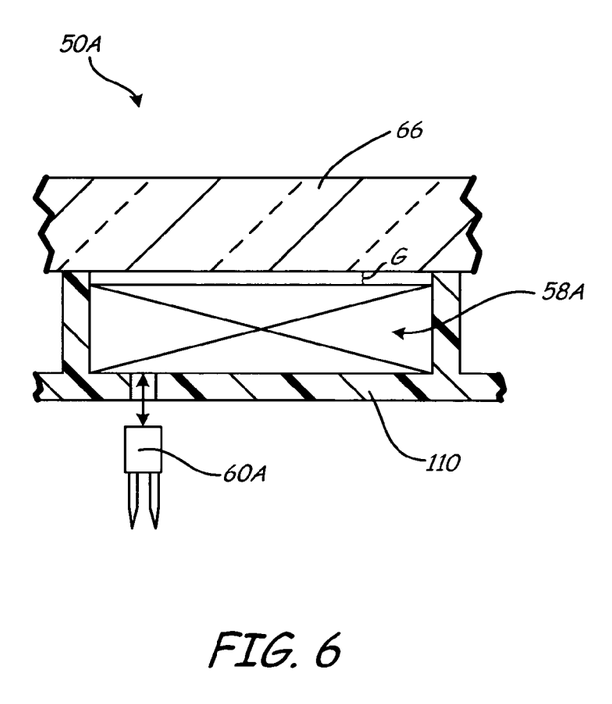
FIG. 6 is a cross-sectional view of a portion of the cover assembly of the field device.

FIG. 6 is a cross-sectional view of a portion of the cover 50A of the field device 42'. As shown in FIG. 6, the electronics subassembly 58A is carried by a shroud 110, and is positioned adjacent to the transparent cover piece 66. A gap G is defined between the electronics subassembly 58A and an interior surface of the transparent cover piece 66 in the illustrated embodiment. The shroud 110 can contact the transparent cover piece 66 and help to control the dimension of the gap G. In one embodiment, the gap G is at least approximately 0.254 mm (0.01 inch), though the dimension of the gap G can be larger or smaller in alternative embodiments. The shroud can be made of a polymer or other suitable material. The electronics subassembly 58A is secured to the shroud 110, such as with suitable fasteners, and the shroud 110, in turn, can be secured to the chassis 92 (not shown in FIG. 6). In this way, the chassis 92, the transparent cover piece 66, the electronics subassembly 58A, and the shroud 110 can be rotationally fixed relative to one another. In the illustrated embodiment, the electrical connector 60A is a male pin-style connector that can be engaged with a mating connector (not shown) with a generally linear insertion motion. In FIG. 6, an operative connection between the electrical connector 60A and the remainder of the electronics subassembly 58A is shown only schematically. Those of ordinary skill in the art will appreciate that any suitable electrical connections can be utilized to form the operative connection, such as hard wires, flex circuits, etc.

Figure 7:
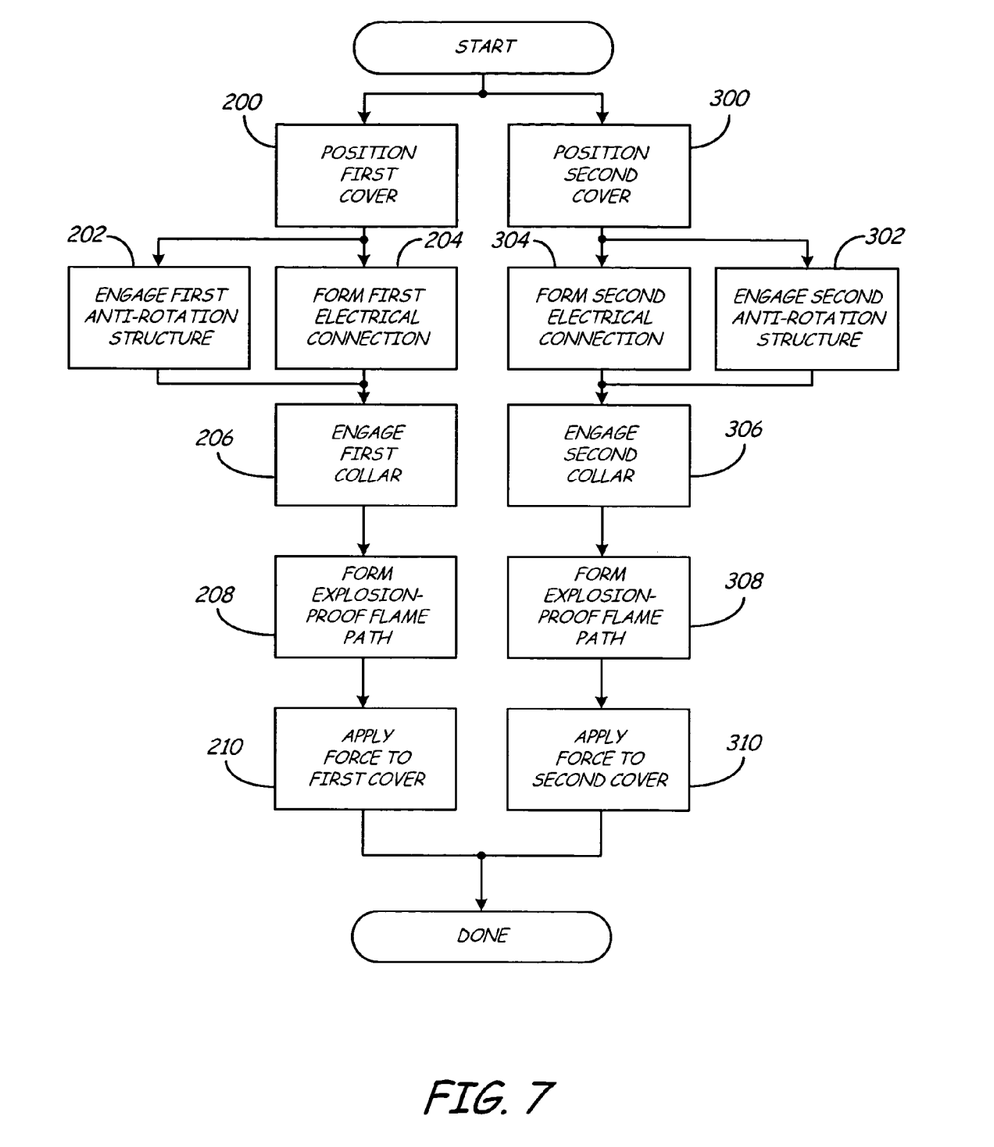
FIG. 7 is a flow chart illustrating a method of assembling a cover and housing assembly for a field device according to the present invention.

FIG. 7 is a flow chart illustrating a method of assembling a cover and housing assembly for a field device. The method illustrated in FIG. 7 is suitable for assembling a field device of the type shown in FIG. 2A, though the method is readily applicable to other embodiments of a field device as well. The method illustrated in FIG. 7 can be used for original fabrication of a field device, for retro-fitting an existing field device, or for providing maintenance to a field device in use in the field.

Initially, as depicted in FIG. 7, a first cover is positioned relative to an opening in a housing, (Step 200), typically with the first cover held in physical contact with the housing. A first anti-rotation structure is engaged between the first cover and the housing (Step 202), and a first electrical connection is formed between electronics carried by the first cover and circuitry carried by the housing (Step 204). The step of forming the first electrical connection (step 204) can be made without rotating the first cover (and its associated electronics) relative to the housing (and its associated circuitry), such as through the use of a substantially linear connection motion between two associated connector elements. A first collar is then engaged to the housing (Step 206). Engagement of the first collar can be with a threaded engagement. An explosion-proof flame path is formed between the first cover and the housing (Step 208). Moreover, the first collar applies force to the first cover to urge the first cover against the housing (Step 210).

Additionally, a second cover is positioned relative to another opening in the housing, (Step 300), typically with the second cover held in physical contact with the housing. A second anti-rotation structure is engaged between the second cover and the housing (Step 302), and a second electrical connection is formed between electronics carried by the second cover and circuitry carried by the housing (Step 304). The step of forming the second electrical connection (step 304) can be made without rotating the second cover (and its associated electronics) relative to the housing (and its associated circuitry), such as through the use of a substantially linear connection motion between two associated connector elements. A second collar is then engaged to the housing (Step 306). Engagement of the second collar can be with a threaded engagement. An explosion-proof flame path is formed between the second cover and the housing (Step 308). Moreover, the second collar applies force to the second cover to urge the second cover against the housing (Step 310).

It should be noted that steps of the method illustrated in FIG. 7 can be performed in any suitable order as desired for particular applications. For instance, steps involving the second cover can be performed before, after or simultaneous with steps involving the first cover. Furthermore, in alternative embodiments, the second cover can be omitted along with all associated assembly steps. Moreover, additional covers can be assembled in a similar manner. Additional steps not specifically mentioned can also be performed in conjunction with the illustrated method.

Those of ordinary skill in the art will appreciate the present invention provides numerous advantages and benefits. For example, the present invention allows electronics to be carried by a cover that is removably engaged with a housing carrying other circuitry. The present invention provides a relatively simple, reliable and easy-to-use interface between components that helps reduce the need flex circuits or other more complex connections. The present invention also permits modularity with respect to different covers carrying different electronics that can be selectively engaged with a particular housing as desired, and can be swapped or interchanged at later times without modifying the circuitry within the housing. This allows for the expansion or modification of functionality provided by a given field device in a simply and easily accomplished manner. Moreover, if multiple openings in a housing were available, a given cover and electronics assembly could be mounted to any opening in the housing. Where the cover carries a local operator interface (LOI), the LOI could thereby be positioned at any opening that provides for the most desirable access for a given transmitter installation. Additional advantages and benefits of the present invention may also be recognized by those of ordinary skill in the art in view of the present disclosure.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, a collar according to the present invention can be engaged to other components in any suitable manner, such as a bayonet engagement between the collar and a housing.

The invention claimed is:

1. A field device assembly for use in an industrial process facility, the assembly comprising:
   a housing body;
   a first circuitry subassembly mounted to the housing body and positioned at least partially within the housing body;
   a first cover chassis having a shoulder at a perimeter thereof;
   a flame path restricting structure positioned on the first cover chassis adjacent to the shoulder;
   a mating flame path restricting structure positioned on the housing body, wherein the flame path restricting structure on the first cover chassis engages the mating flame path restricting structure on the housing body;
   a first threaded collar configured to fit about the first cover chassis and to permit rotation relative to the first cover chassis, wherein the first threaded collar is threadably engaged with the housing body, and wherein the first threaded collar includes an engagement structure engaged with the shoulder of the first cover chassis to secure the first cover chassis to the housing body; and
   a second circuitry subassembly secured to the first cover chassis, the second circuitry subassembly including an electrical connector configured for linear insertion engagement with a mating electrical connector within the housing body to form an electrical connection between the first and second circuitry subassemblies.

2. The assembly of claim 1 and further comprising:
   a transparent cover piece secured to the first cover chassis, wherein at least a portion of the second circuitry subassembly is visible through the transparent cover piece.

3. The assembly of claim 2, wherein the second circuitry subassembly comprises:
   capacitive touch circuitry for providing capacitive touch actuation through the transparent cover piece; and
   digital display circuitry for providing a digital display visible through the transparent cover piece.

4. The assembly of claim 3, wherein the capacitive touch circuitry is separated from the transparent cover piece by an air gap.

5. The assembly of claim 1, wherein the second circuitry subassembly comprises:
   transient protection circuitry.

6. The assembly of claim 1 and further comprising:
   a second cover chassis having a shoulder at a perimeter thereof;
   an additional flame path restricting structure positioned on the first cover chassis adjacent to the shoulder;
   an additional mating flame path restricting structure positioned on the housing body;
   a second threaded collar configured to fit about the second cover chassis and to permit rotation relative to the second cover chassis, wherein the second threaded collar is threadably engaged with the housing body, wherein the second threaded collar includes a engagement structure engaged with the shoulder of the second cover chassis to secure the second cover chassis to the housing body, and wherein the additional flame path restricting structure on the second cover chassis engages the additional mating flame path restricting structure on the housing body; and
   a third circuitry subassembly secured to the second cover chassis, the third circuitry subassembly including an additional electrical connector configured for linear insertion engagement with an additional mating electrical connector within the housing body to form an electrical connection between the first and third circuitry subassemblies.

7. The assembly of claim 6, wherein the second circuitry subassembly comprises digital display circuitry for providing a digital display visible through the transparent cover piece, and wherein the third circuitry subassembly comprises transient protection circuitry.

8. The assembly of claim 7, wherein the second circuitry subassembly further comprises:
   capacitive touch circuitry for providing capacitive touch actuation through the transparent cover piece.

9. The assembly of claim 1, wherein the electrical connector comprises a multi-pin electrical connector.

10. The assembly of claim 1 and further comprising:
    an anti-rotation structure engaged between the first cover chassis and the housing body to restrict rotation of the first cover chassis relative to the housing body.

11. The assembly of claim 1 and further comprising:
    a seal member positioned adjacent to the first threaded collar for providing a fluidic seal.

12. A method of assembling a field device for use in an industrial process facility, the method comprising:
- positioning a first cover against a housing, wherein the first cover is rotationally fixed relative to the housing;
- forming an electrical connection between a first electrical connector carried by the first cover and a second electrical connector carried by the housing, wherein the first and second electrical connectors are rotationally fixed relative to one another when forming the electrical connection therebetween;
- forming an explosion-proof flame path between the first cover and the housing;
- threadably engaging a first collar to the housing; and
- applying force to the first cover with the first collar to secure the first cover to the housing.

13. The method of claim 12 and further comprising:
- forming a fluidic environmental seal between the housing and the first cover.

14. The method of claim 12, wherein the first cover includes a transparent portion, and wherein capacitive touch circuitry is carried by the first cover adjacent to an interior surface of the transparent portion, and wherein an air gap between opposing surfaces of the capacitive touch circuitry and the transparent portion is maintained at a fixed distance after the steps of positioning the first cover against the housing and forming an electrical connection between the first electrical connector carried by the first cover and the second electrical connector carried by the housing.

15. The method of claim 12 and further comprising:
- positioning a second cover against the housing, wherein the second cover is rotationally fixed relative to the housing;
- forming an electrical connection between a third electrical connector carried by the second cover and a fourth electrical connector carried by the housing, wherein the third and fourth electrical connectors are rotationally fixed relative to one another when forming the electrical connection between them;
- forming an explosion-proof flame path between the second cover and the housing;
- threadably engaging a second collar to the housing; and
- applying force to the second cover with the second collar to secure the second cover to the housing.

16. The method of claim 12 and further comprising:
- engaging an anti-rotation structure between the first cover and the housing.

17. A cover assembly for a field device for use in an industrial process facility, the assembly comprising:
- a cover chassis having a shoulder at a perimeter thereof;
- a flame path restricting structure positioned on the cover chassis adjacent to the shoulder;
- a threaded collar configured to fit about the cover chassis and to permit rotation relative to the cover chassis, wherein the threaded collar includes a engagement structure for engaging the shoulder of the cover chassis to secure the cover chassis to an adjacent structure that engages the flame path restricting structure; and
- an electronics subassembly secured to the cover chassis, the electronics subassembly including an electrical connector configured for linear insertion engagement with another electrical connector to form an electrical connection therebetween.

18. The assembly of claim 17 and further comprising:
- a transparent cover piece secured to the cover chassis, wherein at least a portion of the electronics subassembly is visible through the transparent cover piece.

19. The assembly of claim 18, wherein the electronics subassembly comprises:
- capacitive touch circuitry for providing capacitive touch actuation through the transparent cover piece; and
- digital display circuitry for providing a digital display visible through the transparent cover piece.

20. The assembly of claim 17, wherein the electronics subassembly comprises:
- transient protection circuitry.

* * * * *